United States Patent
Tran et al.

(10) Patent No.: US 7,152,187 B2
(45) Date of Patent: Dec. 19, 2006

(54) LOW-POWER SRAM E-FUSE REPAIR METHODOLOGY

(75) Inventors: Tam Minh Tran, Austin, TX (US); George B. Jamison, Murphy, TX (US)

(73) Assignee: Texas Instruments Incorporated, Dallas, TX (US)

(*) Notice: Subject to any disclaimer, the term of this patent is extended or adjusted under 35 U.S.C. 154(b) by 461 days.

(21) Appl. No.: 10/723,377

(22) Filed: Nov. 26, 2003

(65) Prior Publication Data

US 2005/0132255 A1  Jun. 16, 2005

(51) Int. Cl.
*G06F 11/00* (2006.01)
(52) U.S. Cl. .............. 714/42; 714/5; 714/54; 714/710; 714/718; 365/200; 365/201; 365/226; 365/228; 713/324
(58) Field of Classification Search .......... 714/5, 714/42, 54, 710, 711, 718, 763; 713/324; 365/200, 201, 226, 228
See application file for complete search history.

(56) References Cited

U.S. PATENT DOCUMENTS

| | | | |
|---|---|---|---|
| 6,457,108 B1* | 9/2002 | Hsu et al. | 711/154 |
| 6,768,694 B1* | 7/2004 | Anand et al. | 365/225.7 |
| 2003/0154437 A1* | 8/2003 | Chih | 714/763 |
| 2005/0138513 A1* | 6/2005 | Mondal et al. | 714/733 |

* cited by examiner

*Primary Examiner*—Robert Beausoliel
*Assistant Examiner*—Charles Ehne
(74) *Attorney, Agent, or Firm*—Alan K. Stewart; W. James Brady; Frederick J. Telecky, Jr.

(57) ABSTRACT

A low power E-fuse repair methodology substantially removes system latency during memory and/or E-fuse farm module power-down in a device that employs E-fuse farm technology. The method maintains power to the repair registers and minimal control logic in the memories, while all other circuitry can be either placed in a low power data retention mode, or completely powered off. There is no need to rescan the repair data from the E-fuse farm after one or more memories are powered back up. This provides dynamic power savings since there is no longer any need to idle the system to reload repair data. Since the E-fuse farm can be powered down after initial system power-up and repair data is loaded into the memories, there is also a significant leakage power savings.

13 Claims, 2 Drawing Sheets

LOW-POWER SRAM E-FUSE REPAIR METHODOLOGY

BACKGROUND OF THE INVENTION

1. Field of the Invention

This invention relates generally to devices utilizing memories with repair capabilities, and more particularly to a method for substantially removing system latency during memory and/or E-fuse farm module power-down in a device that employs E-fuse farm technology.

2. Description of the Prior Art

Devices utilizing memories with repair capability require an E-fuse farm module be included on the device chip. The E-fuse farm contains the programmable fuse elements for storing the repair information as well as the control logic for programming and loading the repair information into the memories. The repair information is loaded into the memories from the E-fuse farm module upon device power-up via a serial scan chain path connecting the E-fuse farm and the memories. Once the repair information has been scanned into the memories, the E-fuse farm logic performs no additional functions and remains idle. In current implementations, power must be maintained to all memories in the device and the E-fuse farm module. One current E-fuse farm implementation is illustrated in FIG. 1 that depicts a plurality of SRAM memory devices 10, 12, 14, 16, each containing its distinct set of repair data registers 18, 20, 22, 24, connected to an E-fuse farm 26. If power is cut to one or more memories 10, 12, 14, 16 and/or the E-fuse farm 26, the repair information will be lost and access to the memories will not be possible until the device is powered off and then on again to reload the repair data. Current implementations thus provide no methodology to power down one or more memories for low power/leakage applications.

In view of the foregoing, it would be both beneficial and advantageous to provide a method for substantially removing system latency during memory and/or E-fuse farm module power-down in a device that employs E-fuse farm technology.

SUMMARY OF THE INVENTION

To meet the above and other objectives, the present invention provides a method for substantially removing system latency during memory and/or E-fuse farm module power-down in a device that employs E-fuse farm technology. The method maintains power to the repair registers and minimal control logic in the memories, while all other circuitry can be either placed in a low power data retention mode, or completely powered off. There is no need to rescan the repair data from the E-fuse farm after one or more memories are powered back up. This provides dynamic power savings since there is no longer any need to idle the system to reload repair data. Since the E-fuse farm can be powered down after initial system power-up and repair data is loaded into the memories, there is also a significant leakage power savings.

According to one embodiment, a memory repair method comprises the steps of:

providing an E-fuse farm storing memory repair information, and a memory module comprising associated memory module circuitry, power control logic and repair data registers;

powering up the E-fuse farm and the memory module, and loading the repair information into the memory module via the E-fuse farm during the power-up; and maintaining power to the power control logic and repair data registers during loss of power to the E-fuse farm and associated memory module circuitry, such that the memory repair information is retained by the memory module during the loss of power to the E-fuse farm and associated memory module circuitry.

According to another embodiment, a memory repair method comprises the steps of:

providing a device including an E-fuse farm storing memory repair information, and at least one memory module comprising associated memory module circuitry, power control logic and repair data registers;

powering up the device, and transferring the repair information into the memory module via the E-fuse farm during the power-up; and maintaining power to the memory module power control logic and memory module repair data registers during loss of power to the E-fuse farm and associated memory module circuitry, such that the memory repair information is retained by the memory module during the loss of power to the E-fuse farm and associated memory module circuitry.

According to yet another embodiment, a memory device with repair capability comprises:

a supply voltage;

power control logic connected to the supply voltage;

at least one switch connected to the supply voltage;

a memory array connected to the at least one switch;

peripheral logic connected to the at least one switch; and repair data registers connected to the supply voltage and the at least one switch, wherein the at least one switch is operational to remove power to the peripheral logic, the memory array and selected portions of the repair data registers in response to power control logic signals such that memory repair data is retained in the repair data registers subsequent to power down of the peripheral logic, the memory array, and the selected portions of the repair data registers.

According to still another embodiment, a memory device with repair capability comprises:

a supply voltage;

power control logic connected to the supply voltage;

at least one switch selected from the group consisting of a Vss footer switch, and a Vdd header switch;

a memory array connected to the at least one switch;

peripheral logic connected to the at least one switch; and repair data registers connected to the supply voltage and the at least one switch, wherein the at least one switch is operational to remove power to the peripheral logic, the memory array and selected portions of the repair data registers in response to power control logic signals such that memory repair data is retained in the repair data registers subsequent to power down of the peripheral logic, the memory array, and the selected portions of the repair data registers.

According to still another embodiment, a device with memory repair capability comprises:

power management control logic;

an E-fuse farm; and at least one memory module comprising repair data registers, wherein the at least one memory module operates to maintain memory repair data in the repair data registers in response to power management control logic signals during loss of power to portions of the device.

BRIEF DESCRIPTION OF THE DRAWINGS

Other aspects and features of the present invention and many of the attendant advantages of the present invention will be readily appreciated, as the invention becomes better understood by reference to the following detailed description when considered in connection with the accompanying drawing figures thereof and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
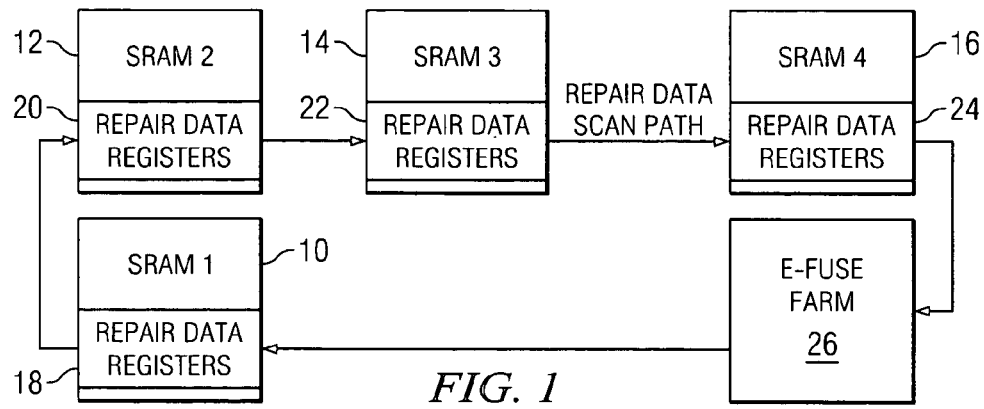
FIG. 1 is a diagram depicting a current E-fuse farm implementation.

FIG. 1 is a diagram depicting a current E-fuse farm implementation. FIG. 1 shows a plurality of SRAM memory devices 10, 12, 14, 16, each containing its distinct set of repair data registers 18, 20, 22, 24, connected to an E-fuse farm 26. If power is cut to one or more memories 10, 12, 14, 16 and/or the E-fuse farm 26, the repair information will be lost and access to the memories will not be possible until the device is powered off and then on again to reload the repair data. The implementation shown in FIG. 1 thus provides no methodology to power down one or more memories for low power/leakage applications.

Figure 2:
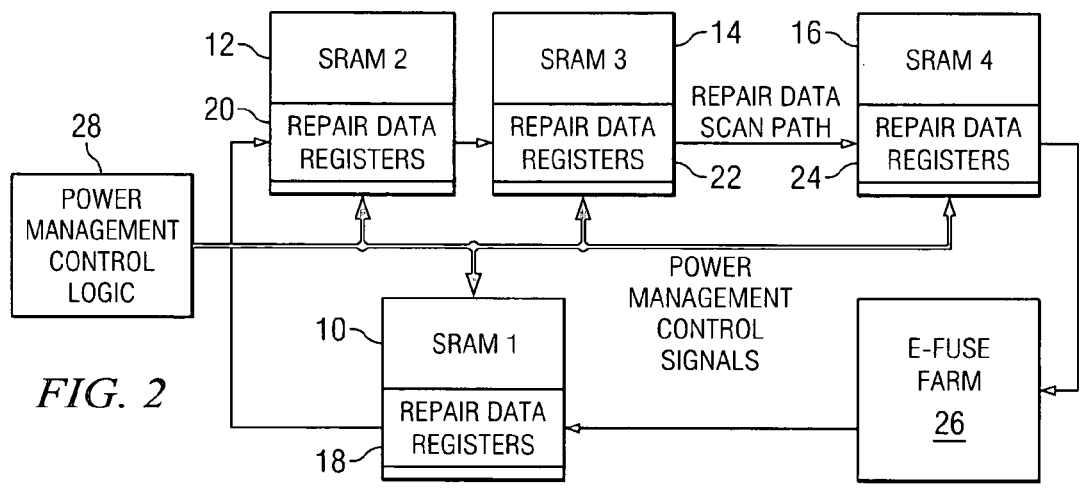
FIG. 2 is a diagram depicting a low power E-fuse farm implementation according to one embodiment of the present invention.

FIG. 2 is a diagram depicting a low power E-fuse farm implementation according to one embodiment of the present invention. The E-fuse farm implementation shown in FIG. 2 is similar to the implementation shown in FIG. 1, except the implementation shown in FIG. 2 can be seen to also employ power management control logic 28. The power management control logic 28 operates to maintain power to the repair data registers 18, 20, 22, 24 and minimal control logic in the memories 10, 12, 14, 16 while all other circuitry is place either in a low power data retention mode, or is completely powered off. As stated herein before, there is no longer any need to rescan the repair data from the E-fuse farm 26 after one or more memories 10, 12, 14, 16 are powered back up, thus reducing dynamic power. The power management control logic 28 allows the E-fuse farm 26 to be powered down after initial system power-up and repair data is loaded into the memories 10, 12, 14, and 16. The present invention is not so limited however, and it shall be understood the principles discussed herein can just as easily be applied to any process technology with no memory or device performance impact.

Figure 3:
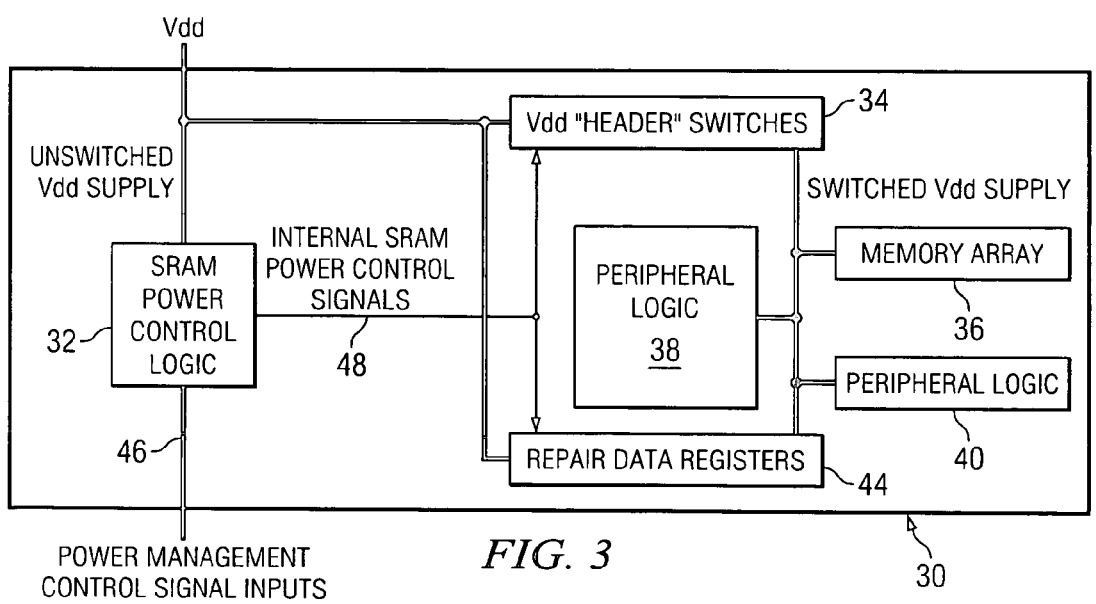
FIG. 3 is a diagram depicting more details associated with one SRAM device shown in FIG. 2.

FIG. 3 is a diagram depicting more details associated with one SRAM device 30 suitable for use in the low power E-fuse implementation shown in FIG. 2. The SRAM 30 can be seen to employ its own internal power control logic 32, Vdd header switches 34, a memory array 36, associated peripheral logic 38, 40, and a set of unique repair registers 44. The Vdd supply to the power control logic 32 and Vdd header switches 34 is unswitched, while the Vdd supply to the memory array 36 and peripheral logic 38, 40 is switched. The Vdd supply to the repair data registers 44 is both switched and unswitched and is implemented in accordance with the power management control input signals 46 and the internal SRAM power control signals 48. The present invention is not so limited however, and it shall be understood that various embodiments are possible to permit design dependent, optimized solutions using the inventive principles described herein. Use of Vss footer switches, for example, can be used rather than the Vdd header switches 34 shown in FIG. 3. The header or footer switches can also be easily be placed outside the memory module 30. Common, external header or footer switches, for example, can also be employed for groups of memories which will be simultaneously powered down.

Figure 4:
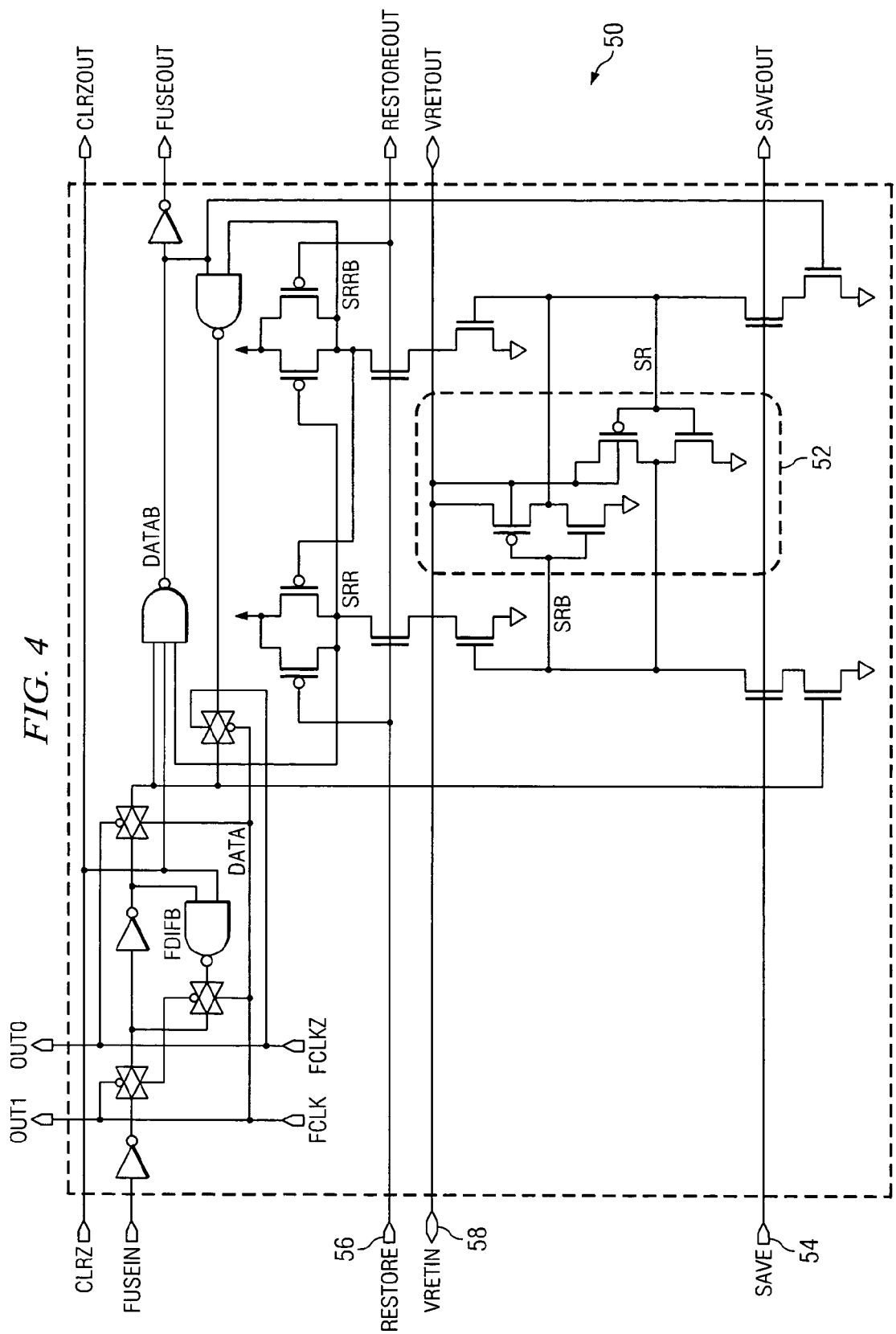
FIG. 4 is a schematic diagram illustrating a repair data storage element circuit according to one embodiment of the present invention.

FIG. 4 is a schematic diagram illustrating a repair data storage element circuit 50 according to one embodiment of the present invention that is suitable for use with the SRAM module 30 shown in FIG. 3. Only the retention latch circuitry 52 remains powered during data retention or off modes to maintain the memory repair data. The SAVE and RESTORE signals 54, 56 are generated from the SRAM power control logic block 32 in FIG. 3, and remain active at all times. These signals isolate the retention latch circuitry 52 before the memory 30 is placed in data retention or off mode. The signals also restore the repair data from the retention latch 52 after the memory 30 exits the retention or off mode. The VRETIN signal 58 is the unswitched Vdd supply for the retention latch 52. The present invention is not so limited however, and those skilled in the art shall readily appreciate the repair data storage element circuit 50 shown in FIG. 4 is but one example of many possible implementations using the inventive principles described herein above.

In view of the above, it can be seen the present invention presents a significant advancement in the art of memory repair techniques. Further, this invention has been described in considerable detail in order to provide those skilled in the memory art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A memory repair method comprising the steps of:
providing an E-fuse farm storing memory repair information, and a memory module comprising associated memory module circuitry, power control logic and repair data registers;
powering up the E-fuse farm and the memory module, and loading the repair information into the memory module via the E-fuse farm during the power-up; and
maintaining power to the power control logic and repair data registers during loss of power to the E-fuse farm and associated memory module circuitry, such that the memory repair information is retained by the memory module during the loss of power to the E-fuse farm and associated memory module circuitry.

2. The method according to claim 1, wherein the step of maintaining power to the power control logic and repair data registers during loss of power to the E-fuse farm and associated memory module circuitry comprises maintaining power solely to data retention latch circuitry associated with the repair data registers.

3. The method according to claim 2, wherein the step of maintaining power to the power control logic and repair data registers during loss of power to the E-fuse farm and associated memory module circuitry further comprises generating memory module power control logic signals to isolate the retention latch circuitry before loss of power to the memory module.

4. The method according to claim 1, wherein the step of powering up the E-fuse farm and the memory module, and loading the repair information into the memory module via the E-fuse farm during the power-up comprises activating a Vdd header switch to provide power to the memory module.

5. The method according to claim 1, wherein the step of powering up the E-fuse farm and the memory module, and loading the repair information into the memory module via the E-fuse farm during the power-up comprises activating a Vss footer switch to provide power to the memory module.

6. A memory repair method comprising the steps of:
providing a device including an E-fuse farm storing memory repair information, and at least one memory module comprising associated memory module circuitry, power control logic and repair data registers;
powering up the device, and transferring the repair information into the memory module via the E-fuse farm during the power-up; and
maintaining power to the memory module power control logic and memory module repair data registers during loss of power to the E-fuse farm and associated memory module circuitry, such that the memory repair information is retained by the memory module during the loss of power to the E-fuse farm and associated memory module circuitry.

7. The method according to claim 6, wherein the step of maintaining power to the memory module power control logic and memory module repair data registers during loss of power to the E-fuse farm and associated memory module circuitry comprises maintaining power solely to data retention latch circuitry associated with the memory module repair data registers.

8. The method according to claim 7, wherein the step of maintaining power to the memory module power control logic and memory module repair data registers during loss of power to the E-fuse farm and associated memory module circuitry further comprises generating memory module power control logic signals to isolate the memory module retention latch circuitry before loss of power to the memory module circuitry.

9. The method according to claim 6, wherein the step of powering up the device, and transferring the repair information into the memory module via the E-fuse farm during the power-up comprises activating at least one Vdd header switch to provide power to the memory module.

10. The method according to claim 6, wherein the step of powering up the device, and transferring the repair information into the memory module via the E-fuse farm during the power-up comprises activating at least one Vss footer switch to provide power to the memory module.

11. A device with memory repair capability comprising:
power management control logic;
an E-fuse farm; and
at least one memory module comprising repair data registers, wherein the at least one memory module operates to maintain memory repair data in the repair data registers in response to power management control logic signals during loss of power to portions of the device.

12. The device according to claim 11, wherein the at least one memory module comprises:
a supply voltage;
power control logic connected to the supply voltage;
at least one switch selected from the group consisting of a Vss footer switch, and a Vdd header switch;
a memory array connected to the at least one switch;
peripheral logic connected to the at least one switch; and
repair data registers connected to the supply voltage and the at least one switch, wherein the at least one switch is operational to remove power to the peripheral logic, the memory array and selected portions of the repair data registers in response to power control logic signals such that memory repair data is retained in the repair data registers subsequent to power down of the peripheral logic, the memory array, and the selected portions of the repair data registers.

13. The device according to claim 11, wherein the repair data registers comprise retention latch circuitry operational to store and maintain the memory repair data.

* * * * *